(12) United States Patent
Kim et al.

(10) Patent No.: US 10,840,221 B2
(45) Date of Patent: Nov. 17, 2020

(54) SEMICONDUCTOR MODULE

(71) Applicant: SAMSUNG ELECTRONICS CO., LTD., Suwon-si (KR)

(72) Inventors: Ilsoo Kim, Hwaseong-si (KR); Heeyoub Kang, Seoul (KR); Young-Rok Oh, Seoul (KR); Kitaek Lee, Hwaseong-si (KR); Hwi-Jong Yoo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/783,665

(22) Filed: Feb. 6, 2020

(65) Prior Publication Data

US 2020/0176423 A1    Jun. 4, 2020

Related U.S. Application Data

(63) Continuation of application No. 16/024,940, filed on Jul. 2, 2018, now Pat. No. 10,593,648, which is a
(Continued)

(30) Foreign Application Priority Data

Nov. 14, 2016   (KR) .................. 10-2016-0151426
Feb. 15, 2017   (KR) .................. 10-2017-0020645

(51) Int. Cl.
*H01L 25/065* (2006.01)
*H01L 23/36* (2006.01)
(Continued)

(52) U.S. Cl.
CPC .......... *H01L 25/0657* (2013.01); *H01L 23/36* (2013.01); *H01L 23/3735* (2013.01); *H01L 23/3737* (2013.01); *H01L 23/544* (2013.01); *H01L 25/105* (2013.01); *H05K 1/18* (2013.01); *H01L 2223/54406* (2013.01);
(Continued)

(58) Field of Classification Search
CPC ... H01L 25/0657; H01L 23/36; H01L 25/105; H01L 23/544; H01L 23/3735; H01L 23/3737; H01L 2223/54406; H01L 2223/54433; H01L 2224/48091; H01L 2224/16225; H01L 2224/48145
See application file for complete search history.

(56) References Cited

U.S. PATENT DOCUMENTS 4,630,891 A   12/1986 Li
4,858,073 A    8/1989 Gregory
(Continued)

FOREIGN PATENT DOCUMENTS

KR   1020070011695 A   1/2007
KR   1020100016715 A   2/2010
KR   1020160026029 A   3/2016

*Primary Examiner* — Kyoung Lee
*Assistant Examiner* — Christina A Sylvia
(74) *Attorney, Agent, or Firm* — Volentine, Whitt & Francos, PLLC (57) ABSTRACT

A semiconductor module includes a substrate, a first package mounted on the substrate, second packages mounted on the substrate, a label layer provided on the substrate, and a heat transfer structure interposed between the substrate and the label layer and overlapping at least two of the second packages in a plan view of the module.

18 Claims, 9 Drawing Sheets

Related U.S. Application Data continuation of application No. 15/812,482, filed on Nov. 14, 2017, now Pat. No. 10,529,692.

(51) Int. Cl.
*H01L 23/373* (2006.01)
*H01L 23/544* (2006.01)
*H01L 25/10* (2006.01)
*H05K 1/18* (2006.01)

(52) U.S. Cl.
CPC ............... *H01L 2223/54433* (2013.01); *H01L 2224/16225* (2013.01); *H01L 2224/48091* (2013.01); *H01L 2224/48145* (2013.01)

(56) References Cited

U.S. PATENT DOCUMENTS

| | | | |
|---|---|---|---|
| 5,396,403 A | 3/1995 | Patel | |
| 6,479,431 B1 * | 11/2002 | McFall | C10M 129/54 503/200 |
| 6,533,700 B2 | 4/2003 | Hirayam et al. | |
| 6,553,700 B1 | 4/2003 | Hirayama et al. | |
| 7,034,387 B2 | 4/2006 | Karnezos | |
| 7,819,508 B2 | 10/2010 | Kuriki et al. | |
| 7,981,508 B1 | 7/2011 | Sharma et al. | |
| 8,076,772 B2 | 12/2011 | Hwang et al. | |
| 8,080,874 B1 * | 12/2011 | Werner | H05K 1/181 257/723 |
| 9,123,686 B2 | 9/2015 | Mataya et al. | |
| 9,548,256 B2 | 1/2017 | Uehling | |
| 2003/0099827 A1 | 5/2003 | Shih et al. | |
| 2003/0189246 A1 * | 10/2003 | Iwaki | H01L 25/162 257/706 |
| 2004/0104373 A1 | 6/2004 | Dutmer et al. | |
| 2006/0056213 A1 | 3/2006 | Lee et al. | |
| 2006/0220865 A1 | 10/2006 | Babine et al. | |
| 2008/0124839 A1 | 5/2008 | Saiki et al. | |
| 2010/0059203 A1 * | 3/2010 | Chu | G06F 1/20 165/80.3 |
| 2011/0073661 A1 | 3/2011 | Forster | |
| 2012/0098123 A1 * | 4/2012 | Yu | H01L 23/49822 257/737 |
| 2013/0036802 A1 | 2/2013 | Johnson et al. | |
| 2013/0049221 A1 | 2/2013 | Han et al. | |
| 2013/0139524 A1 | 6/2013 | Kim et al. | |
| 2014/0168902 A1 * | 6/2014 | Park | H01L 21/561 361/719 |
| 2014/0219681 A1 | 8/2014 | Harada et al. | |
| 2014/0353383 A1 | 12/2014 | Gentelet et al. | |
| 2015/0179285 A1 * | 6/2015 | Kilmer | G11C 29/025 365/200 |
| 2015/0380061 A1 * | 12/2015 | Matsumoto | H05K 1/113 365/51 |
| 2016/0072626 A1 | 3/2016 | Kouladjie | |
| 2016/0163616 A1 | 6/2016 | Fachmann et al. | |
| 2016/0242321 A1 | 8/2016 | Van Haaster et al. | |
| 2016/0268190 A1 | 9/2016 | McKnight-MacNeil et al. | |
| 2016/0268229 A1 | 9/2016 | Matsumoto et al. | |
| 2016/0305829 A1 | 10/2016 | Emadi | |
| 2017/0024840 A1 * | 1/2017 | Holub | G06T 1/005 |

* cited by examiner

SEMICONDUCTOR MODULE

PRIORITY STATEMENT

This is a Continuation of U.S. application Ser. No. 16/024,940, filed Jul. 2, 2018, which issued as U.S. Pat. No. 10,593,648 on Mar. 17, 2020, and is a Continuation of U.S. application Ser. No. 15/812,482, filed Nov. 14, 2017, which issued as U.S. Pat. No. 10,529,692 on Jan. 7, 2020, and claims priority under 35 U.S.C. § 119 to Korean Patent Application Nos. 10-2016-0151426, filed on Nov. 14, 2016, and 10-2017-0020645, filed on Feb. 15, 2017 in the Korean Intellectual Property Office, the entire contents of which are hereby incorporated by reference.

BACKGROUND OF THE INVENTION

The inventive concept relates to a semiconductor module. In particular, the inventive concept relates to a semiconductor module having structure for transferring heat generated by components of the module.

One aim of the electronics industry is to manufacture light, small, fast, and high-performance electronic products cost-effectively. Nowadays, these products include one or more semiconductor chips. A semiconductor chip may be provided in package form, which makes it possible to integrate the semiconductor chip easily into the electronic product. Moreover, there is an increasing demand for compact electronic products that operate at higher and higher speeds while storing and processing greater amounts of data. Thus, electronic products may include several semiconductor packages and these packages may be combined in a module. However, as semiconductor devices consume electric power and generate heat, thermal characteristics of the semiconductor packages are becoming more and more important especially when the packages are combined as part of a single module.

SUMMARY

According to examples of the inventive concept, a semiconductor module includes a substrate, a first package mounted on the substrate, second packages mounted on the substrate, a label layer on the substrate, and heat transfer structure interposed between the substrate and the label layer. The heat transfer structure overlaps at least two of the second packages in a plan view of the semiconductor module.

According to examples of the inventive concept, a semiconductor module includes a substrate having first and second surfaces facing in opposite directions, a first package mounted on the first surface of the substrate, second packages each mounted on the first surface of the substrate, a first label layer disposed on the second surface of the substrate, and a first heat transfer structure interposed between the substrate and the first label layer. The first package comprises a logic chip, and the second packages comprising memory chips. The first heat transfer structure is spaced apart from the first package. The first heat transfer structure also overlaps at least two of the second packages in a plan view of the semiconductor module.

According to examples of the inventive concept, a semiconductor module includes a substrate, a label layer disposed on the substrate, and a heat transfer structure interposed between the substrate and the label layer, the heat transfer structure comprising a stack of metal layers.

According to examples of the inventive concept, an electronic module includes a substrate and electrical terminals disposed at a first surface of the substrate, a first semiconductor device package disposed on the first surface of the substrate, second semiconductor device packages disposed on the first surface of the substrate, and a heat distributor fixed to the substrate. The first semiconductor device package includes a die and the first semiconductor device package is electrically connected to respective ones of the electrical terminals of the substrate. Each of the second semiconductor device packages includes a dies and each of the second semiconductor device packages is electrically connected to respective ones of the electrical terminals of the substrate. A proximal one of the second semiconductor device packages is disposed closer to the first semiconductor device package than a distal one of the second semiconductor device packages. The heat distributor includes at least one layer of thermally conductive material that overlaps the proximal and distal ones of the second semiconductor device packages, but does not overlap the first semiconductor device package, in a plan view of the electronic module, and the heat distributor is electrically isolated in the module.

BRIEF DESCRIPTION OF THE DRAWINGS

The inventive concept will be more clearly understood from the following brief description of examples thereof taken in conjunction with the accompanying drawings. The accompanying drawings represent non-limiting examples of the inventive concept.

These figures illustrate the general characteristics of methods, structures and/or materials utilized in certain examples and to supplement the written description provided below. These drawings are not, however, to scale and may not precisely reflect the precise structural or performance characteristics of any given example, and should not be considered as defining or limiting the range of values or properties encompassed by the examples. For example, the relative thicknesses and positioning of molecules, layers, regions and/or structural elements may be reduced or exaggerated for clarity. The use of similar or identical reference numbers in the various drawings intends to indicate similar elements or features.

DETAILED DESCRIPTION

Hereinafter, some examples of a semiconductor module according to the inventive concept will be described with reference to the accompanying drawings.

Figure 1A:
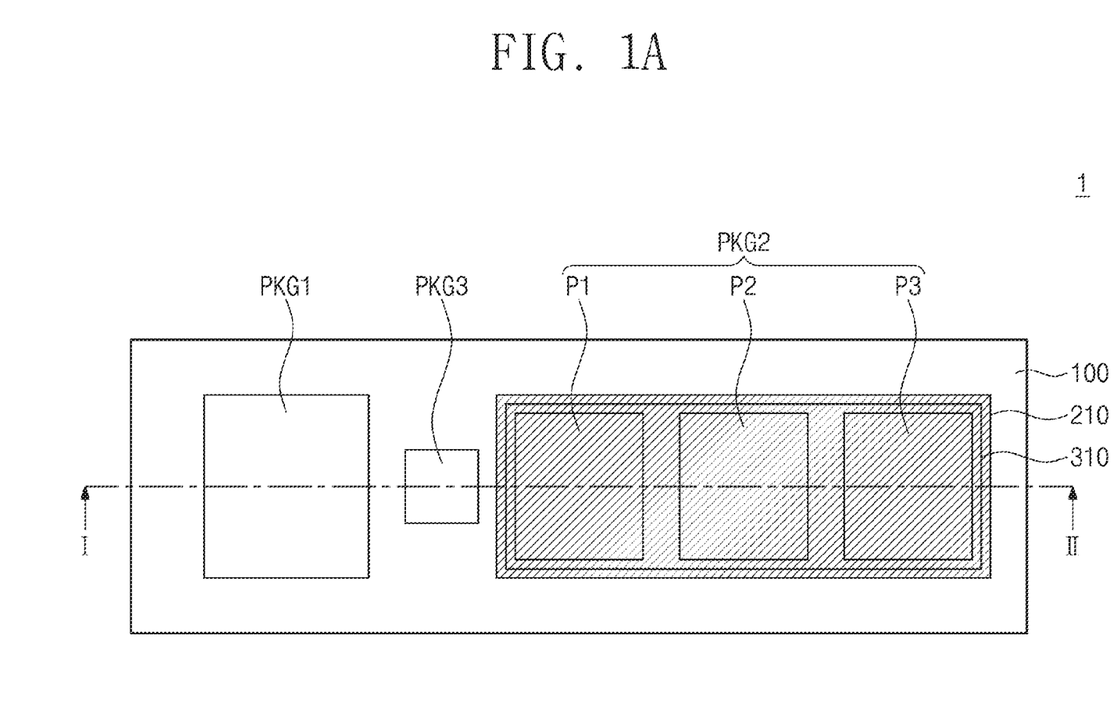
FIG. 1A is a plan view of examples of a semiconductor module according to of the inventive concept.
Figure 1B:
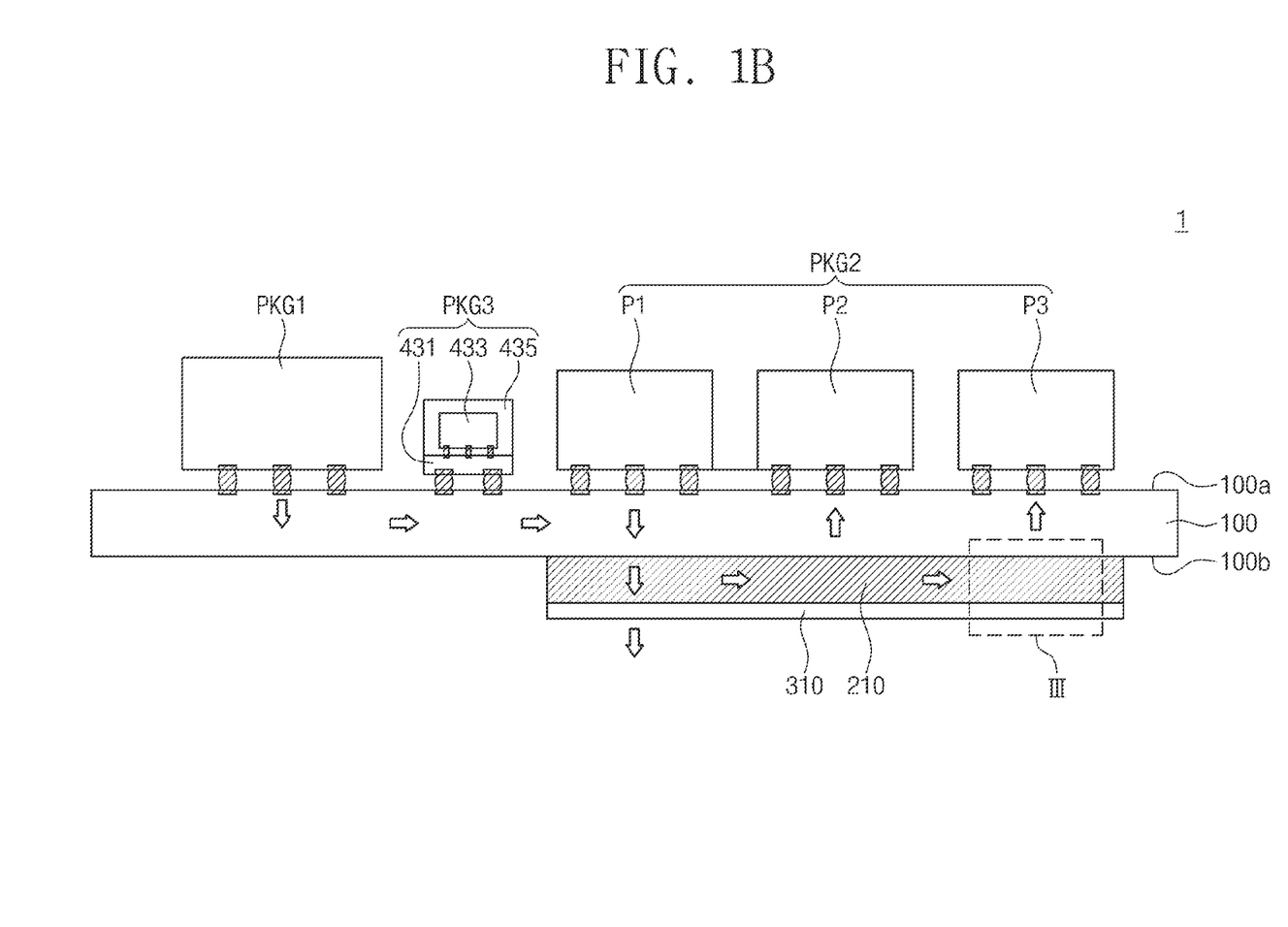
FIG. 1B is a sectional view taken along line I-II of FIG. 1A.
Figure 1C:
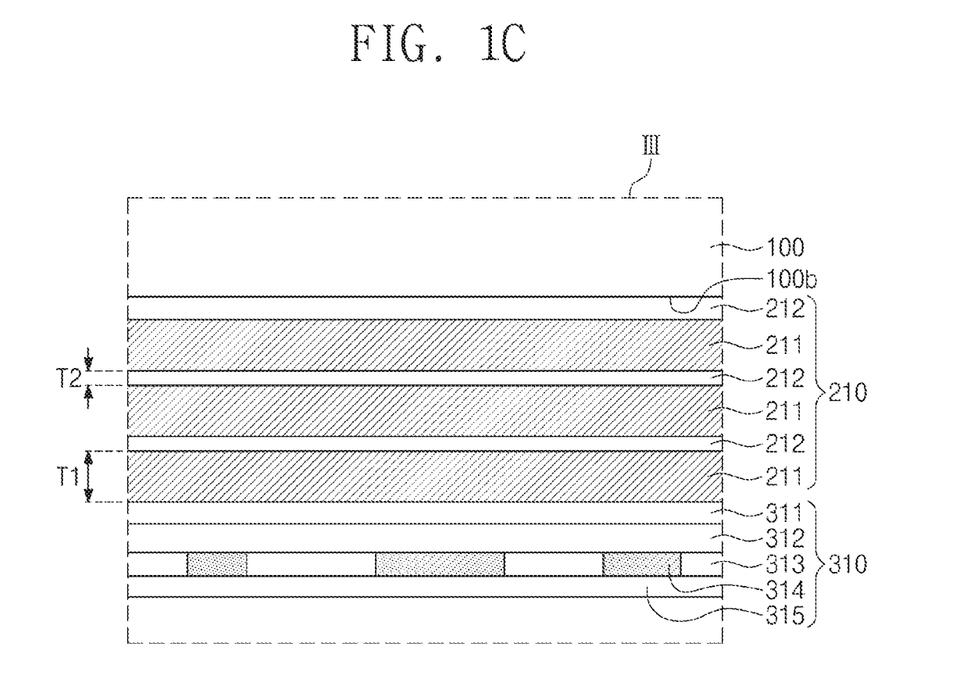
FIG. 1C is an enlarged sectional view of a portion 'III' of FIG. 1B.

FIG. 1A is a plan view illustrating examples of a semiconductor module according to the inventive concept. FIG. 1B is a sectional view taken along line I-II of FIG. 1A. FIG. 1C is an enlarged sectional view of a portion 'III' of FIG. 1B.

Referring to FIGS. 1A and 1B, a semiconductor module 1 may include a substrate 100, a first package PKG1, second packages PKG2, a third package PKG3, a first heat transfer structure 210, and a first label layer 310. The semiconductor module 1 may be a memory module. The semiconductor module 1 may be a solid-state drive (SSD) module, but the inventive concept is not limited thereto. A board of the substrate 100 may have a first surface 100a and a second surface 100b facing in opposite directions, and electrical terminals (shown but not numbered) at the first surface 100a. The terminals may be pads or lands of electrically conductive material as shown. The board of the substrate may include one or more layers of electrical insulating material. Accordingly, the substrate 100 may be a printed circuit board (PCB). Thus, the substrate 100 may also have distribution wiring (not shown) in the form of conductive traces at the first surface 100a and/or an internal wiring layer(s) and vias electrically connected to the terminals at the first surface 100a. Also not shown, a connector may be disposed on the first or second surface 100a or 100b of the substrate 100 as electrically connected to the terminals at the first surface 100a. The substrate 100 may be electrically connected to an external device via the connector.

The first package PKG1 may be mounted on the first surface 100a of the substrate 100. The first package PKG1 may include a logic chip. The first package PKG1 may be a controller package. For example, the first package PKG1 may include a die configured to read or write data from or to the second packages PKG2, in response to commands input to the semiconductor module 1. When the semiconductor module 1 is operated, heat generated in the first package PKG1 may be greater than the heat generated in each of the second packages PKG2 and the third package PKG3. That is, the first package PKG1 may generate heat at a rate greater than the rate at which each the second packages PKG2 and the third package PKG3 generates heat.

Each of the second packages PKG2 may be mounted on the first surface 100a of the substrate 100. The second packages PKG2 may be spaced apart from the first package PKG1. The second packages PKG2 may be memory packages including memory chips, i.e., may include dies having memory cells. For example, the second packages PKG2 may include nonvolatile memory chips. The second packages PKG2 may have large memory capacity and high performance. The second packages PKG2 may be particularly vulnerable to heat, compared to the first package PKG1 and the third package PKG3. For example, a warranty temperature of the second packages PKG2 may be lower than the warranty temperatures of each of the first package PKG1 and the third package PKG3. If, during the operation of the semiconductor module 1, the package PKG1, PKG2, or PKG3 is heated to temperature higher than its warranty temperature, its performance may suffer or it may be damaged. Here, the term "warranty temperature" will be understood by those in the art as a specification of the package obtained through design and testing. The warranty temperature may be provided in literature or a label accompanying the package.

The second packages PKG2 may include a first semiconductor package P1, a second semiconductor package P2, and a third semiconductor package P3. The first semiconductor package P1, the second semiconductor package P2, and the third semiconductor package P3 may be spaced apart from each other. The distance between the first semiconductor package P1 and the first package PKG1 may be smaller than the distance between the second semiconductor package P2 and the first package PKG1 and may be smaller than the distance between the third semiconductor package P3 and the first package PKG1. The distance between the second semiconductor package P2 and the first package PKG1 may be smaller than the distance between the third semiconductor package P3 and the first package PKG1. Here, the term "distance" refers to the shortest straight-line distance in the direction in which the packages are spaced from each other along the first surface 100a of the substrate. Thus, the second semiconductor package P1 may be considered as a proximal package and the second semiconductor package P2 (as well as the third semiconductor package P3) may be considered a distal package with respect to the first package PKG1. The warranty temperature of the first semiconductor package P1 may be substantially the same as those of the second and third semiconductor packages P2 and P3.

The first heat transfer structure 210 may be disposed on the second surface 100b of the substrate 100. In a plan view, the first heat transfer structure 210 may overlap at least two of the second packages PKG2 located closest to the first package PKG1. Here, the term "overlap" as used to describe upper and lower elements in a plan view means that the elements are vertically juxtaposed with at least part of the upper one of the elements extending directly over at least part of the lower one of the elements. The first heat transfer structure 210 may overlap at least the first semiconductor package P1. In FIG. 1B, the arrows depict the flow of heat during the operation of the semiconductor module 1. In this example, a large amount of thermal energy is given off by the first package PKG1 during the operation of the semiconductor module 1. Thus, a substantial amount of the thermal energy from the first package PKG1 may be supplied to the first semiconductor package P1 of the second packages PKG2, i.e., the package closest to the first package PKG1.

In certain cases depending on the positions of the packages P1, P2 and P3 relative to each other and to the first package PKG1, the first semiconductor package P1 may be heated up to temperature that is higher than those of the second semiconductor package P2 and the third semiconductor package P3, during the operation of the semiconductor module 1. In this example, the first heat transfer structure 210 has a thermal conductivity higher than that of the substrate 100. Thus, the heat transfer structure 210 is a heat distributor. That is, heat generated in the first semiconductor package P1 may be quickly transferred to the first heat transfer structure 210 via the substrate 100 because the first heat transfer structure 210 is overlapped with the first semiconductor package P1. Alternatively, a large part of the thermal energy from the first package PKG1 may be transferred to the first heat transfer structure 210 via the substrate 100, whereas a very tiny part thereof may be supplied to the first semiconductor package P1.

In a plan view, the first heat transfer structure 210 may overlap the second semiconductor package P2 and the third semiconductor package P3. Thus, part of the thermal energy to be supplied to the first heat transfer structure 210 may be supplied to the second semiconductor package P2 or the third semiconductor package P3. In certain examples, part of the thermal energy supplied to the first heat transfer structure 210 may be dissipated to the outside via the first label layer 310. Accordingly, the first semiconductor package P1 may be prevented from being heated to temperature higher than its warranty temperature and consequently the performance of the first semiconductor package P1 may be prevented from being thermally deteriorated. As a result, the operational reliability of the semiconductor module 1 may be improved. In certain examples, the first heat transfer structure 210 may not overlap the third semiconductor package P3, when viewed in plan.

The first heat transfer structure 210 may be spaced apart from the first package PKG1. Accordingly, it may be possible to effectively prevent or suppress thermal energy generated by the first package PKG1, during the operation of the semiconductor module 1, from being transferred to the first semiconductor package P1 via the first heat transfer structure 210. Furthermore, this may make it possible to improve thermal characteristics and operational reliability of the semiconductor module 1.

The first label layer 310 may be disposed on the second surface 100b of the substrate 100, to cover the first heat transfer structure 210. Hereinafter, the first heat transfer structure 210 and the first label layer 310 will be described in more detail with reference to FIG. 1C.

Referring to FIG. 1C, the first heat transfer structure 210 may include discrete heat conduction (i.e., thermally conductive) layers 211 and adhesive layers 212. The heat conduction layers 211 may be stacked one on another on the second surface 100b of the substrate 100. The heat conduction layers 211 may be formed of or include a metallic material. The heat conduction layers 211 may have higher thermal conductivity than that of the first label layer 310. As an example, the heat conduction layers 211 may be formed of or include copper whose thermal conductivity is about 401 W/mk. Each of the heat conduction layers 211 may be relatively thin. For example, the thickness T1 of each of the heat conduction layers 211 may range from 25 μm to 50 μm (in particular, from 25 μm to 35 μm). Therefore, the first heat transfer structure 210 may be produced as flexible. In this case, the first heat transfer structure 210 may be easily incorporated into the semiconductor module 1 during a process of fabricating the semiconductor module 1. For example, a roll of thin heat conduction layers that are adhered to one another and that is easily cut may be used to provide first heat transfer structure 210.

The adhesive layers 212 may be interposed between the substrate 100 and the heat conduction layers 211 and between the heat conduction layers 211. Each of the adhesive layers 212 may have a thickness T2 smaller than the thickness T1 of each of the heat conduction layers 211. For example, the thickness T2 of each of the adhesive layers 212 may range from 1 μm to 25 μm (in particular, 5 μm to 25 μm). This may facilitate rapid heat transfer between the heat conduction layers 211. The adhesive layers 212 may be formed of or include at least one acrylic polymer. In certain examples, the adhesive layers 212 include a thermal interface material (TIM). The adhesive layers 212 may be flexible. Although not illustrated, the first heat transfer structure 210 may consist of, i.e., have only, one heat conduction layer 211 and the adhesive layer 212.

Conductive patterns, e.g., circuit patterns, (not shown) may not be exposed through the second surface 100b of the substrate 100. The adhesive layers 212 may be formed of or include an insulating material. The first heat transfer structure 210 may be electrically isolated in the module, i.e., may be electrically insulated from all of the circuitry of the module. In particular, first heat transfer structure 210 may be electrically isolated from the substrate 100, the packages PKG1, PKG2, and PKG3, etc.

The first label layer 310 may include an adhesion film 311, a facestock layer 312, a first ink pattern 313, and a second ink pattern 314. The facestock layer 312 may have ink patterns 313 and 314 printed thereon. As an example, the facestock layer 312 may be formed of or include polyethylene terephthalate. As other examples, the facestock layer 312 may be formed of or include a polymer film or a sheet of paper. The first ink pattern 313 may be of a first color. The second ink pattern 314 may be of a second color different from the first color. The facestock layer 312 and markings thereon, e.g., the first ink pattern 313 and the second ink pattern 314, may serve as a label providing information about the semiconductor module 1. The label may also include a coating layer 315 covering the first ink pattern 313 and the second ink pattern 314. The coating layer 315 may be transparent. Thus, a user may be able to discern the colors and forms of the first and second ink patterns 313 and 314, i.e., information about the semiconductor module 1. For example, the coating layer 315 may be formed of or include a polymeric material, such as polyester. The coating layer 315 may be formed by a lamination process.

Referring back to FIGS. 1A and 1B, the third package PKG3 may be mounted on the substrate 100. The third package PKG3 may be disposed on the first surface 100a of the substrate 100 and may be spaced apart from the first package PKG1 and the second packages PKG2. The third package PKG3 may be disposed in line with and interposed between the first package PKG1 and the second packages PKG2. However, the inventive concept is not limited to such a relative position of the third package PKG3. The third package PKG3 may include a third package substrate 431, a third semiconductor chip 433, and a third mold layer 435. The third semiconductor chip 433 may serve as a buffer memory chip. For example, the third semiconductor chip 433 may be configured to temporarily store data to be transmitted between the first package PKG1 and the second packages PKG2 and/or between the first package PKG1 and an external device (not shown). The third semiconductor chip 433 may be or include a random access memory device, such as DRAM or SRAM device. Although not illustrated, the third package PKG3 may include a plurality of third semiconductor chips 433. Although the third package PKG3 is illustrated as mounted on the substrate 100 in a flip-chip manner, bonding wires (not shown) may be used to connect the third package PKG3 to the substrate 100.

Although the first, second, and third packages PKG1, PKG2, and PKG3 are illustrated as provided on the first surface 100a of the substrate 100, the inventive concept is not limited thereto. For example, at least one of the first, second, and third packages PKG1, PKG2, and PKG3 may be disposed on the second surface 100b of the substrate 100.

In addition, the first heat transfer structure 210 and the first label layer 310 may assume positions in the module other than those illustrated. At least one of the first heat transfer structure 210 and the first label layer 310 may extended further laterally than illustrated in FIGS. 1A and 1B. As an example, at least one of the first heat transfer structure 210 and the first label layer 310 may extend so far as to overlap the third package PKG3, when viewed in plan. As another example, at least one of the first heat transfer structure 210 and the first label layer 310 may overlap the first package PKG1, when viewed in plan.

Figure 1D:
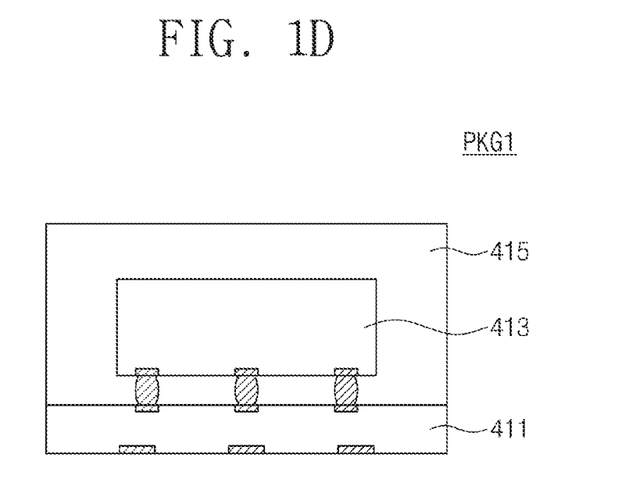
FIG. 1D is a sectional view of a first package of a semiconductor module according to the inventive concept.

FIG. 1D is a sectional view illustrating an example of a first package of a module according to the inventive concept.

For brevity, a description of an element already described, and identified by the same reference number, may not be repeated.

Referring to FIG. 1D, the first package PKG1 may include a first package substrate 411, a first semiconductor chip 413, and a first mold layer 415. The first semiconductor chip 413 may be mounted on the first package substrate 411. The first semiconductor chip 413 may include a logic chip, such as a communication device, a digital signal processor, a controller, or a system-on-chip. The first mold layer 415 may be disposed on the first package substrate 411 to cover the first semiconductor chip 413.

Figure 1E:
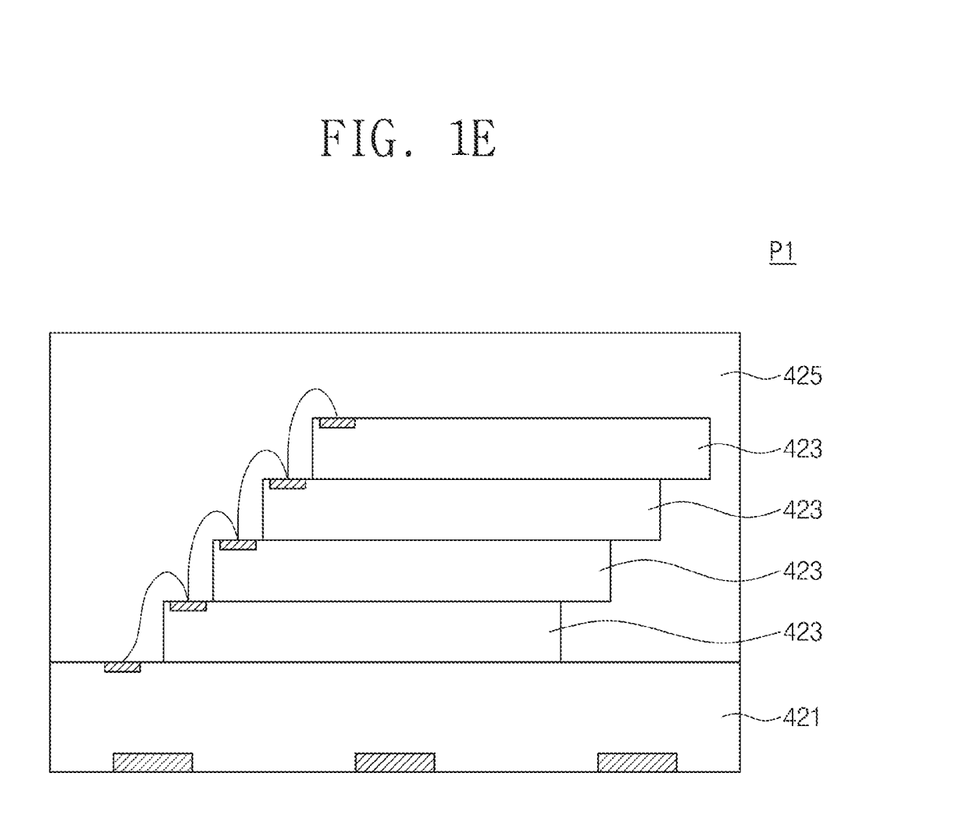
FIG. 1E is a sectional view of a first semiconductor package of a semiconductor module according to the inventive concept.

FIG. 1E is a sectional view illustrating an example of a first semiconductor package of a module according to the inventive concept.

Referring to FIG. 1E, the first semiconductor package P1 may include a second package substrate 421, second semiconductor chips 423, and a second mold layer 425. The second semiconductor chips 423 may be stacked on the second package substrate 421. The second semiconductor chips 423 may be nonvolatile memory chips. As an example, each of the second semiconductor chips 423 may be or include a NAND FLASH memory chip. As another example, each of the second semiconductor chips 423 may be or include a PRAM, MRAM, ReRAM, FRAM, or NOR FLASH memory chip. The second semiconductor chips 423 may be connected to the second package substrate 421 by bonding wires. In certain examples, the second semiconductor chips 423 have a plurality of through vias (not shown) and may be mounted on the second package substrate 421 in a flip-chip manner. The number and positions of the second semiconductor chips 423 are not limited to those illustrated, however.

Referring to FIG. 1E in conjunction with FIG. 1B, each or at least one of the second and third semiconductor packages P2 and P3 may have substantially the same structure and function as those of the first semiconductor package P1 described with reference to FIG. 1E.

Figure 2:
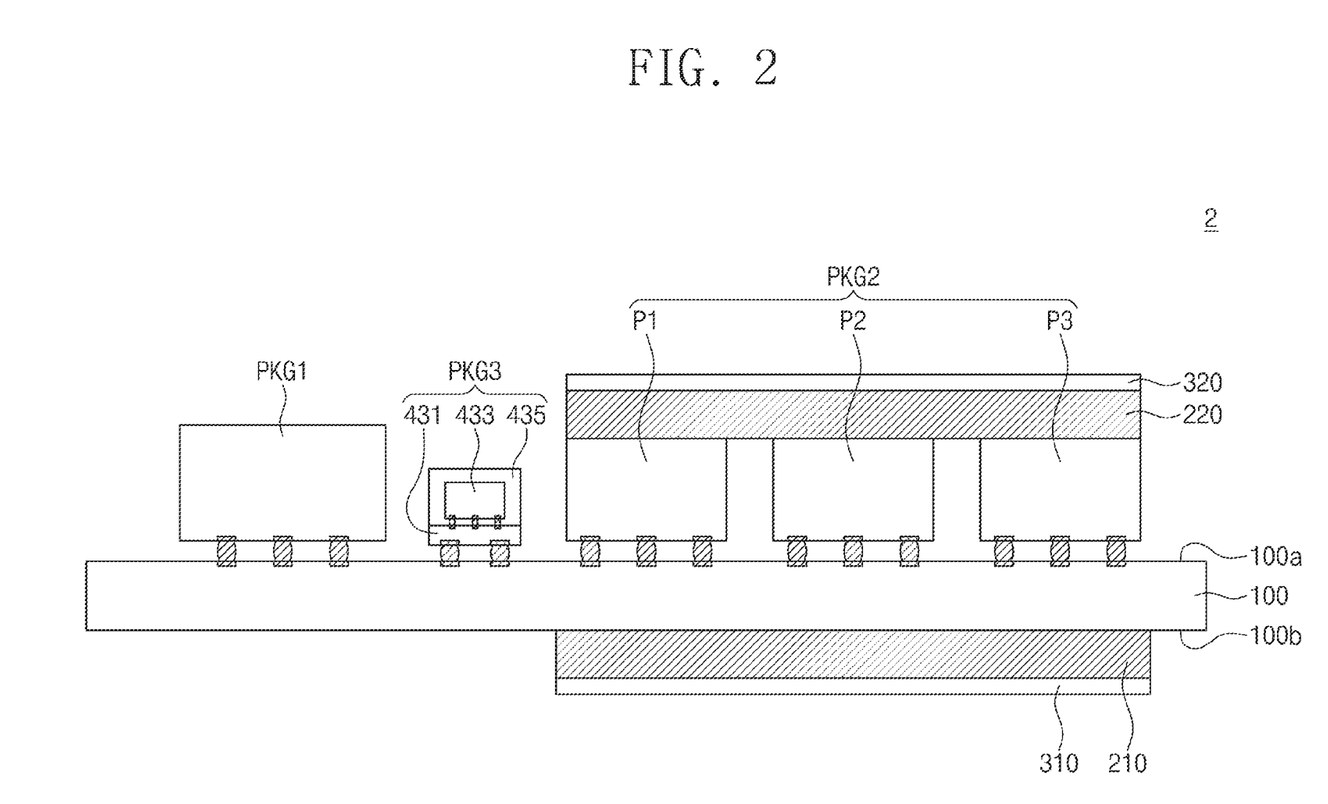
FIG. 2 is a sectional view of an example of a semiconductor module according to the inventive concept.

FIG. 2 is a sectional view illustrating other examples of a semiconductor module according to of the inventive concept. Again, like numerals designate like elements and detailed descriptions of such elements will not be repeated here, for the sake of brevity.

Referring to FIG. 2, a semiconductor module 2 may include a second heat transfer structure 220 and a second label layer 320, in addition to the substrate 100, the first package PKG1, the second packages PKG2, the third package PKG3, the first heat transfer structure 210, and the first label layer 310. The substrate 100, the first package PKG1, the second packages PKG2, the third package PKG3, the first heat transfer structure 210, and the first label layer 310 may have substantially the same features as those described with reference to FIGS. 1A to 1E. For example, the first heat transfer structure 210 may be interposed between the second surface 100b of the substrate 100 and the first label layer 310.

The second heat transfer structure 220 may be disposed on the first surface 100a of the substrate 100. In a plan view, the second heat transfer structure 220 may overlap at least two of the second packages PKG2. The second heat transfer structure 220 may contact top surfaces of the first and second semiconductor packages P1 and P2. In certain examples, the second heat transfer structure 220 may cover a top surface of the third semiconductor package P3. Heat generated in the first semiconductor package P1 may be distributed to the second semiconductor package P2 and the third semiconductor package P3 through the second heat transfer structure 220. The second heat transfer structure 220 may be spaced apart from the first package PKG1. Accordingly, it may be possible to prevent or suppress heat, which is generated from the first package PKG1 during the operation of the semiconductor module 2, from being transferred to the second packages PKG2 via the second heat transfer structure 220. The second heat transfer structure 220 may include a plurality of the heat conduction layers 211 and a plurality of the adhesive layers 212, similar to the first heat transfer structure 210 previously described with reference to FIG. 1C.

The second label layer 320 may be disposed over the first surface 100a of the substrate 100, to cover the second heat transfer structure 220. The second label layer 320 may include the adhesion film 311, the facestock layer 312, the first ink pattern 313, the second ink pattern 314, and the coating layer 315, similar to the first label layer 310 described with reference to FIG. 1C. In this example, the adhesion film 311 faces the second heat transfer structure 220.

In another example, at least one of the first heat transfer structure 210 and the first label layer 310 is/are omitted.

Figure 3A:
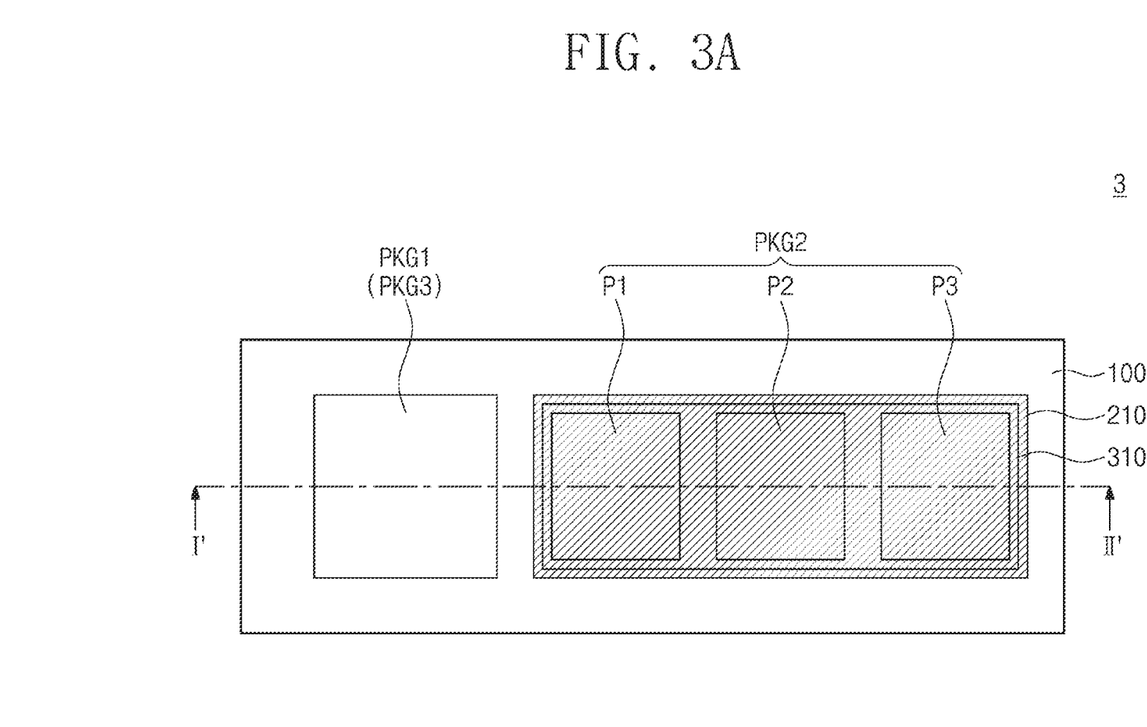
FIG. 3A is a plan view of an example of a semiconductor module according to the inventive concept.
Figure 3B:
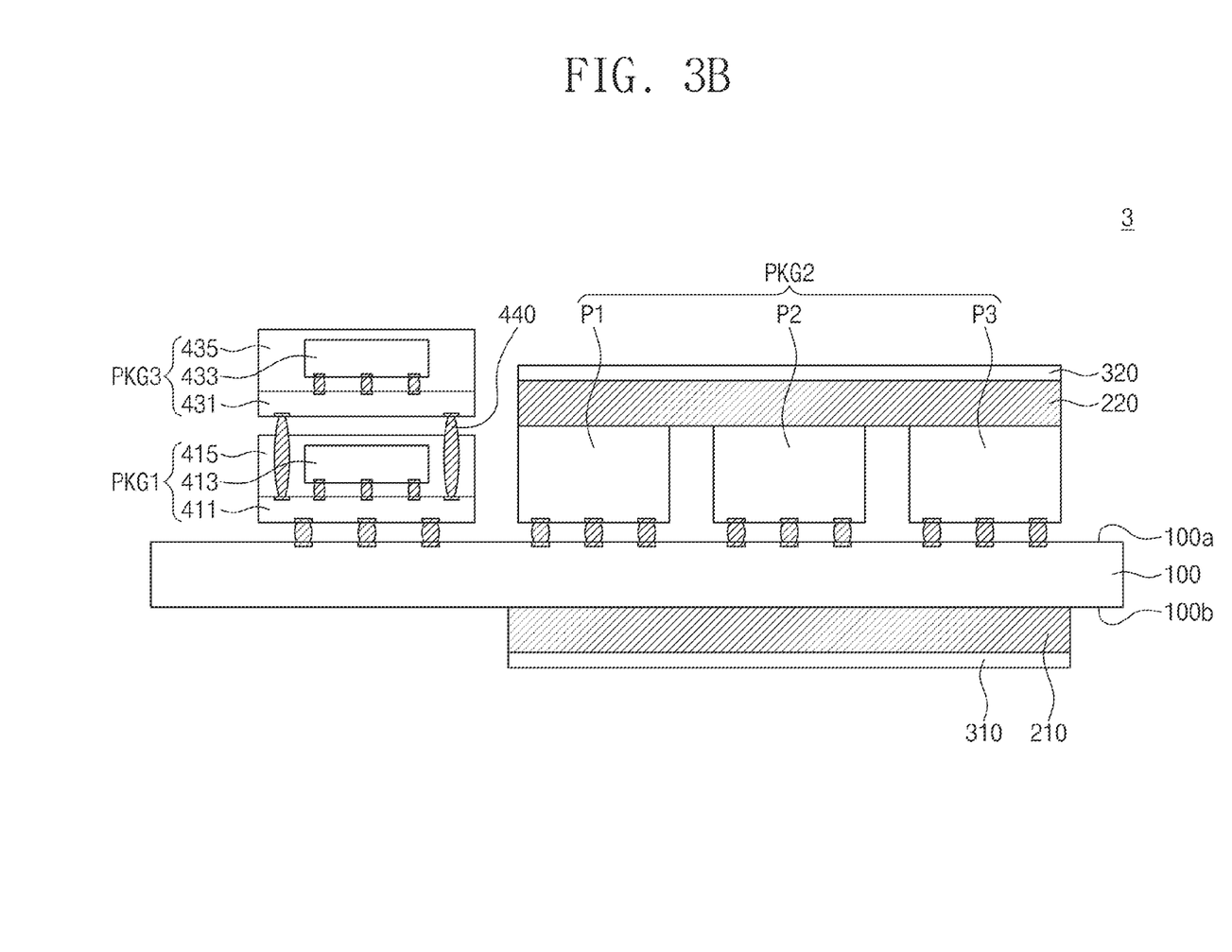
FIG. 3B is a sectional view taken along line I'-II' of FIG. 3A.

FIG. 3A is a plan view illustrating a semiconductor module according to examples of the inventive concept. FIG. 3B is a section taken along line MI' of FIG. 3A. Here as well, like reference numerals designate like elements which will not be described in detail again.

Referring to FIGS. 3A and 3B, a semiconductor module 3 may include the substrate 100, the first package PKG1, the second packages PKG2, the third package PKG3, the first heat transfer structure 210, the first label layer 310, the second heat transfer structure 220, and the second label layer 320. The second heat transfer structure 220 may be interposed between the second packages PKG2 and the second label layer 320. As another example, at least one of the first heat transfer structure 210, the first label layer 310, the second heat transfer structure 220, and the second label layer 320 is/are omitted.

The first package PKG1 may include the first package substrate 411, the first semiconductor chip 413, and the first mold layer 415. The first semiconductor chip 413 may be or include a logic chip, as previously described with reference to FIG. 1D. The first package PKG1 may be a controller package, as described with reference to FIGS. 1A and 1B.

The third package PKG3 may be stacked on the first package PKG1. The third package PKG3 may include the third package substrate 431, the third semiconductor chip 433, and the third mold layer 435. The third semiconductor chip 433 may be or include a semiconductor chip that is of a type different from that of the first semiconductor chip 413. The third semiconductor chip 433 may be a buffer memory chip, as described with reference to FIGS. 1A and 1B. A connection terminal 440 may be interposed between the first package PKG1 and the third package PKG3 (e.g., between the first package substrate 411 and the third package substrate 431). The connection terminal 440 may be coupled to the first package PKG1 and the third package PKG3. The third package PKG3 may be electrically connected to the first package PKG1 via the connection terminal 440. The third package PKG3 may be stacked on the first package PKG1, and in this case, it may be possible to minimize the size of the semiconductor module 3.

Figure 4A:
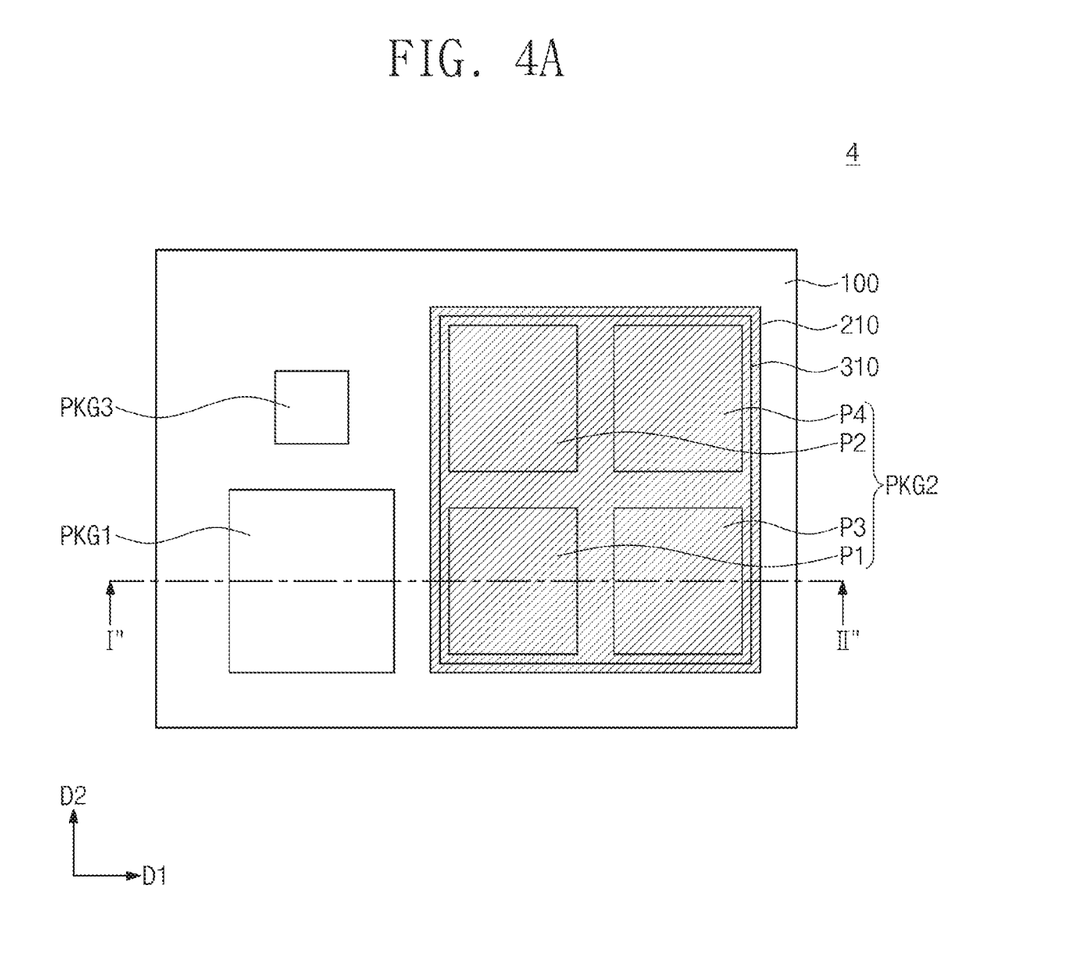
FIG. 4A is a plan view of an example of a semiconductor module according to the inventive concept.
Figure 4B:
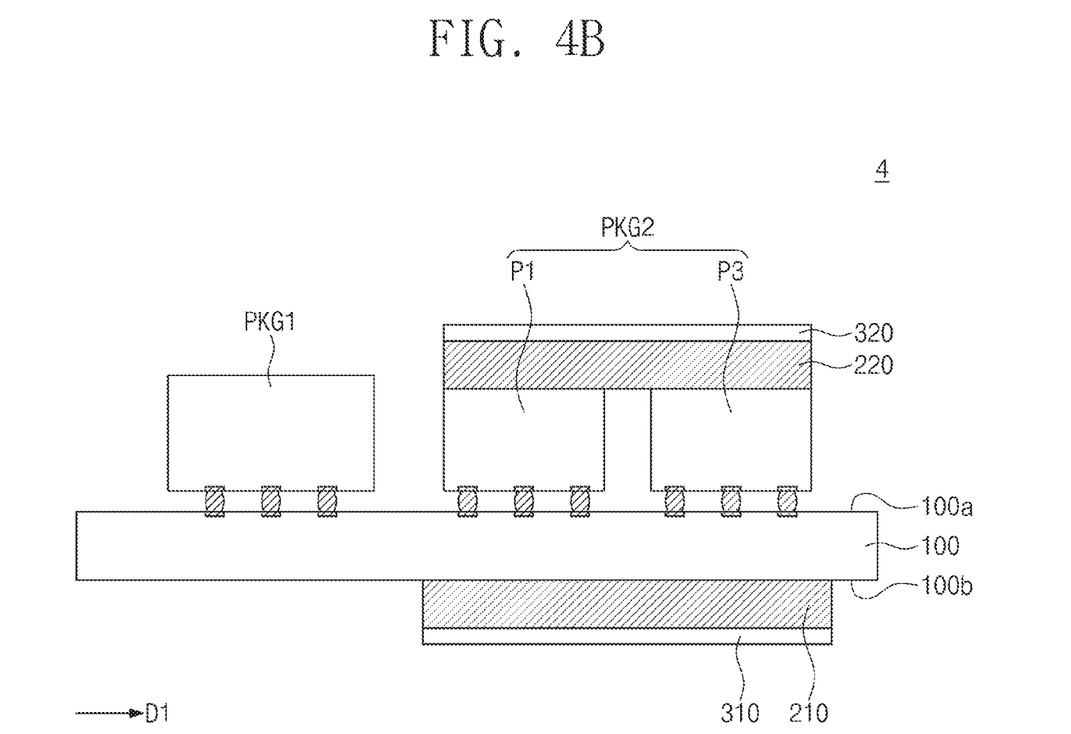
FIG. 4B is a sectional view taken along line I"-II" of FIG. 4A.

FIG. 4A is a plan view illustrating other examples of a semiconductor module according to the inventive concept. FIG. 4B is a section taken along line I'-II" of FIG. 4A. Here as well, like reference numerals designate like elements already described in detail.

Referring to FIGS. 4A and 4B, a semiconductor module 4 may include the substrate 100, the first package PKG1, the second packages PKG2, the third package PKG3, the first heat transfer structure 210, and the first label layer 310. The second packages PKG2 may be arranged in rows, which are parallel to a first direction D1, and in columns, which are parallel to a second direction D2. Here, the first direction D1 and the second direction D2 may be parallel to the first surface 100a of the substrate 100. The second direction D2 may cross the first direction D1. The second packages PKG2 may include first to fourth semiconductor packages P1, P2, P3, and P4. The distance between the first package PKG1 and the first semiconductor package P1 may be smaller than each of the respective distances between the first package PKG1 and the second to fourth semiconductor packages P2, P3, and P4. The distance between the first package PKG1 and the second semiconductor package P2 may be smaller than the distance between the first package PKG1 and the third semiconductor package P3. The distance between the first package PKG1 and fourth semiconductor package P4 may be larger than each of the respective distances between the first package PKG1 and the first to third semiconductor packages P1, P2, and P3. The relative position of the second packages PKG2 is not limited to that in the illustrated example. The first heat transfer structure 210 may overlap the first semiconductor package P1, when viewed in plan. The first heat transfer structure 210 may overlap at least one of the second to fourth semiconductor packages P2, P3, and P4. The first heat transfer structure 210 may be spaced apart from the first package PKG1.

The second heat transfer structure 220 may be disposed on the first semiconductor package P1. The second heat transfer structure 220 may be disposed on at least one of the second to fourth semiconductor packages P2, P3, and P4. The second heat transfer structure 220 may be spaced apart from the first package PKG1. The second label layer 320 may be disposed on the second heat transfer structure 220.

In certain examples, at least one of the first heat transfer structure 210, the first label layer 310, the second heat transfer structure 220, and the second label layer 320 is/are omitted.

According to a semiconductor module of the inventive concept, a heat transfer structure overlaps at least two of second packages in a plan view of the module. Thus, even if the second packages are vulnerable to heat, it may be possible to exhaust heat, which is generated from the second package during the operation of a semiconductor module, to the outside of the semiconductor module through the heat transfer structure. Accordingly, operational reliability of the second package may be improved. Furthermore, the heat transfer structure may be spaced apart from the first package, in the plan view. Thus, even if a large amount of heat is generated from the first package, at least some of the heat generated from the first package can be prevented from being transferred to the second package.

Although examples of the inventive concepts have been particularly shown and described, it will be understood by one of ordinary skill in the art that variations in form and detail may be made to such examples without departing from the spirit and scope of the inventive concept as set forth in the attached claims.

What is claimed is:

1. A semiconductor module, comprising:
   a module substrate having first and second surfaces opposite to each other, and electrical terminals at the first surface;
   a first package mounted on the first surface of the module substrate and comprising a logic chip;
   a second package mounted on the module substrate on the first surface and comprising a memory chip;
   a heat conduction layer provided on the first package and the second package and having a first surface facing the first package and the second package and a second surface opposite to the first surface;
   a label layer on the second surface of the heat conduction layer, the label layer overlapping the first package and the second package in a plan view of the semiconductor module; and
   an adhesive layer provided on and being in contact with the first surface of the heat conduction layer,
   wherein a thickness of the adhesive layer is smaller than a thickness of the heat conduction layer, and
   further comprising a third package mounted on the module substrate,
   wherein each of the heat conduction layer and the label layer overlapping the third package in a plan view of the semiconductor module; and
   wherein the third package comprises:
   a third package substrate having third package terminals on a bottom surface thereof, the third package terminals electrically connected to the module substrate, and
   a buffer memory chip mounted on a top surface of the third package substrate, the buffer memory chip electrically connected to the module substrate by the third package substrate.

2. The semiconductor module of claim 1, wherein a thermal conductivity of the heat conduction layer is higher than a thermal conductivity of the module substrate.

3. The semiconductor module of claim 2, wherein the thermal conductivity of the heat conduction layer is higher than a thermal conductivity of the label layer.

4. The semiconductor module of claim 1, wherein the thickness of the heat conduction layer ranges from 25 μm to 50 μm.

5. The semiconductor module of claim 4, wherein the thickness of the adhesive layer ranges from 1 μm to 25 μm.

6. The semiconductor module of claim 1, wherein the second package comprises a plurality of second packages being spaced laterally from each other along the first surface of module substrate,
   wherein the label layer overlaps with the plurality of the second packages in a plan view of the semiconductor module; and
   wherein the heat conduction layer overlaps with the plurality of the second packages in a plan view of the semiconductor module.

7. The semiconductor module of claim 1, wherein the label layer comprises:
   a facestock layer having a first surface facing toward the heat conduction layer and an opposite second surface;
   an ink pattern on the second surface of the facestock layer; and
   an adhesive film the facestock layer and the heat conduction layer.

8. The semiconductor module of claim 1, wherein the first package further comprises a first package substrate having first package terminals on a bottom surface thereof, the first package terminals electrically connected to the module substrate, and
   wherein the logic chip mounted on a top surface of the first package substrate and electrically connected to the module substrate by the first package substrate.

9. The semiconductor module of claim 8, wherein the second packages further comprise a second package substrate having second package terminals on a bottom surface thereof, the second package terminals electrically connected to the module substrate; and wherein the memory chip comprises a plurality of memory chips stacked on a top surface of the second package substrate.

10. The semiconductor module of claim 1, wherein the second surface of the heat conduction layer contacts the label layer.

11. A semiconductor module, comprising:

a module substrate having first and second surfaces opposite to each other and including electrical terminals provided on the first surface thereof;

a first package mounted on the first surface of the module substrate and including a logic chip;

a plurality of memory packages mounted on the first surface of the module substrate and being spaced laterally from each other along the first surface of the module substrate;

a label layer provided on the module substrate, the label layer overlapping the first package and the plurality of the memory packages in a plan view of the semiconductor module; and a heat conduction layer interposed between the module substrate and the label layer, the heat conduction layer overlapping the first package and the plurality of the memory packages in a plan view of the semiconductor module, wherein the heat conduction layer has a thickness of between 25 μm and 50 μm, wherein a minimum distance between the first package and the memory packages is greater than a distance between the memory packages, and wherein the label layer comprises:
an ink pattern having a color;
a facestock layer between the ink pattern and the heat conduction layer; and
an adhesive film between the facestock layer and the heat conduction layer.

12. The semiconductor module of claim 11, further comprising an adhesive layer provided on a first surface of the heat conduction layer, wherein the adhesive layer has a thickness smaller than the thickness of the heat conduction layer, and wherein the label layer is provided on a second surface of the heat conduction layer, the second surface of the heat conduction layer opposite to the first surface of the heat conduction layer.

13. The semiconductor module of claim 11, wherein a thermal conductivity of the heat conduction layer is higher than a thermal conductivity of the label layer.

14. The semiconductor module of claim 11, further comprising a second package disposed on the module substrate and being spaced laterally from the first package and the memory packages, wherein the second package comprises a package substrate and a buffer memory chip mounted on the package substrate.

15. A semiconductor module, comprising:

a module substrate having first and second surfaces facing in opposite directions, and electrical terminals on the first surface;

a first package mounted on the module substrate and including a first substrate and a first semiconductor chip;

a plurality of second packages mounted on the first surface of the module substrate and being spaced laterally from each other along the first surface of the module substrate, wherein each of the plurality of second packages comprises a second semiconductor chip different type from the first semiconductor chip;

a third package mounted on the module substrate and being spaced laterally from the first package and the plurality of second packages, the third package comprising a third substrate and a buffer memory chip mounted on the third substrate;

a label layer on the module substrate, the label layer overlapping the first package, the plurality of the second packages, and the third package in a plan view of the semiconductor module; and a heat transfer structure between the module substrate and the label layer, the heat transfer structure overlapping the first package and the plurality of the second packages in a plan view of the semiconductor module, wherein a thermal conductivity of the heat transfer structure is higher than a thermal conductivity of the module substrate, and wherein a minimum distance between the first package and the second packages is greater than a distance between the second packages.

16. The semiconductor module of claim 15, wherein the first package comprises a controller package, and wherein the plurality of second packages comprise memory packages.

17. The semiconductor module of claim 15, wherein at least one of the second package further comprises a second substrate having package terminals on a bottom surface thereof, wherein the second semiconductor chip comprises a plurality of memory chips stacked on a top surface of the second substrate and electrically connected to the package terminals.

18. The semiconductor module of claim 15, the label layer comprises:

a facestock layer provided on the heat transfer structure and having a first surface and second surface opposite to each other, the first surface facing toward the heat transfer structure;

an ink pattern on the second surface of the facestock layer;

a coating layer covering the ink pattern; and an adhesive film interposed between the heat transfer structure and the first surface of facestock layer.

* * * * *